(12) United States Patent
Lee

(10) Patent No.: US 8,530,956 B2
(45) Date of Patent: Sep. 10, 2013

(54) NON-VOLATILE MEMORY DEVICE AND METHOD FOR FABRICATING THE SAME

(75) Inventor: Sang-Bum Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/277,496

(22) Filed: Oct. 20, 2011

(65) Prior Publication Data

US 2012/0168824 A1    Jul. 5, 2012

(30) Foreign Application Priority Data

Dec. 30, 2010    (KR) ........................ 10-2010-0138837

(51) Int. Cl.
*H01L 29/792*    (2006.01)

(52) U.S. Cl.
USPC .................... 257/324; 257/326; 257/E21.423

(58) Field of Classification Search
USPC ................................................ 257/324–326
See application file for complete search history.

(56) References Cited

U.S. PATENT DOCUMENTS

2012/0032249 A1*    2/2012 Matsuda .................... 257/324

FOREIGN PATENT DOCUMENTS

| KR | 1020090128776 | 12/2009 |
|---|---|---|
| KR | 1020100034612 | 4/2010 |
| KR | 1020100052416 | 5/2010 |
| KR | 1020110048452 | 5/2011 |

OTHER PUBLICATIONS

Notice of Allowance issued by the Korean Intellectual Property Office on Sep. 26, 2012.
Office Action issued by the Korean Intellectual Property Office on Dec. 29, 2011.
Ryota Katsumata, et al.,"Pipe-shaped BiCS Flash Memory with 16 Stacked Layers and Multi-Level-Cell Operation for Ultra High Density Storage Devices,".
2009 Symposium on VLSI Technology Digest of Technical Papers, pp. 136-137, IEEE.

* cited by examiner

*Primary Examiner* — Cheung Lee
*Assistant Examiner* — Christopher Johnson
(74) *Attorney, Agent, or Firm* — IP & T Group LLP

(57) ABSTRACT

A non-volatile memory device including a memory string including a plurality of memory cells coupled in series. The non-volatile memory device includes the memory string including a first semiconductor layer and a second conductive layer with a memory gate insulation layer therebetween, a first selection transistor comprising a second semiconductor layer coupled with one end of the first semiconductor layer, a second selection transistor comprising a third semiconductor layer coupled with the other end of the first semiconductor layer, and a fourth semiconductor layer contacting the first semiconductor layer in a region where the second conductive layer is not disposed.

20 Claims, 17 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2010-0138837, filed on Dec. 30, 2010, which is incorporated herein by reference in its entirety.

BACKGROUND OF THE INVENTION

Exemplary embodiments of the present invention relate to a non-volatile memory device and a fabrication method thereof, and more particularly, to a non-volatile memory device having a three-dimensional (3D) structure where memory cells are formed along channels protruding perpendicular to a substrate, and a method for fabricating the same.

A non-volatile memory device retains data stored therein although a power source is cut off. At present, diverse non-volatile memory devices, such as flash memory, are widely used.

As the improvement in the integration degree of a two-dimensional memory device which is fabricated in a single layer over a silicon substrate reaches limitations, a three-dimensional non-volatile memory device which is fabricated by stacking a plurality of memory cells along channels protruding perpendicularly to a silicon substrate is introduced.

FIG. 1 is a cross-sectional view illustrating a three-dimensional non-volatile memory device.

Referring to FIG. 1, a first conductive layer 11 for forming a gate electrode of a pipe-channel transistor, a structure where a first inter-layer dielectric layer 12 and a second conductive layer 13 are alternately stacked to form a plurality of layers of memory cells, and a structure where a second inter-layer dielectric layer 16, a third conductive layer 17, and the second inter-layer dielectric layer 16 are sequentially stacked to form a selection transistor are disposed over a substrate 10.

A pair of cell channel holes is formed to penetrate the stacked structure of the first inter-layer dielectric layer 12 and the second conductive layer 13, and a pipe channel hole is disposed in the first conductive layer 11 to couple the lower portions of the pair of cell channel holes to each other. The pair of selection channel holes penetrates the stacked structure of the second inter-layer dielectric layer 16, the third conductive layer 17 and the second inter-layer dielectric layer 16.

A memory gate insulation layer 14 is disposed on the internal walls of the cell channel holes and the pipe-channel hole, and the cell channel holes and the pipe-channel hole where the memory gate insulation layer 14 is disposed are filled with a first channel layer 15. Also, a gate insulation layer 18 is disposed on the internal walls of the selection channel holes adjacent to the stacked structure of the second inter-layer dielectric layer 16, the third conductive layer 17 and the second inter-layer dielectric layer 16, and the portions of the selection channel holes where the gate insulation layer 18 is disposed are filled with a second channel layer 19.

As a result, a pipe channel transistor, multiple layers of memory cells, and a selection transistor are disposed over the substrate 10. The pipe channel transistor includes the first conductive layer 11, and the memory gate insulation layer 14 and the first channel layer 15 that are formed inside of the pipe channel holes. The multiple layers of memory cells include the memory gate insulation layer 14 and the first channel layer 15 that are formed inside of the pair of cell channel holes, and the second conductive layer 13 which is stacked vertically along the memory gate insulation layer 14 and the first channel layer 15. The multiple layers of memory cells along with one of the pair of cell channel holes and the multiple layers of memory cells along with the other of the pair of cell channel holes are separated from each other by a slit S. The selection transistor includes the gate insulation layer 18 and the second channel layer 19 that are formed inside of the pair of selection channel holes, and the third conductive layer 17. The selection transistor along with one of the pair of selection channel holes and the selection transistor along with the other of the pair of selection channel holes are separated from each other by the slit S.

In the structure of the three-dimensional non-volatile memory device described above, the channel layers are not directly coupled with the substrate. This means that the three-dimensional non-volatile memory device does not include a layer which functions as a substrate body where well pick-up regions are formed. Therefore, it is impossible to perform a data erase operation by applying an erase voltage to a substrate body in the known three-dimensional non-volatile memory device of FIG. 1, and instead, the known three-dimensional non-volatile memory device performs an erase operation by supplying holes based on a Gate-Induced Drain Leakage (GIDL) effect.

However, when an erase operation is performed based on the GIDL effect, the erase rate may decrease because holes are not sufficiently supplied. In particular, as the length of a channel layer disposed vertically increases, the erase rate further decreases.

SUMMARY OF THE INVENTION

Exemplary embodiments of the present invention are directed to a non-volatile memory device that may perform an F-N tunneling erase operation by providing a layer which functions as a substrate body although a channel layer of a memory cell is not directly coupled with a substrate, and a method for fabricating the same.

In accordance with an exemplary embodiment of the present invention, a non-volatile memory device comprising a memory string including a plurality of memory cells coupled in series, includes: the memory string including a first semiconductor layer and a second conductive layer with a memory gate insulation layer therebetween, a first selection transistor comprising a second semiconductor layer coupled with one end of the first semiconductor layer, a second selection transistor comprising a third semiconductor layer coupled with the other end of the first semiconductor layer, and a fourth semiconductor layer contacting the first semiconductor layer in a region where the second conductive layer is not disposed.

In accordance with another exemplary embodiment of the present invention, a method for fabricating a non-volatile memory device, including a memory string including a plurality of memory cells coupled in series, includes: forming the memory string including a first semiconductor layer and a second conductive layer with a memory gate insulation layer therebetween, and forming second and third semiconductor layers respectively coupled with one end and the other end of the first semiconductor layer, and a fourth semiconductor layer coupled with the first semiconductor layer in a region where the second conductive layer is not disposed.

In accordance with yet another exemplary embodiment of the present invention a method for fabricating a non-volatile memory device includes: forming a first conductive layer over a substrate, selectively etching the first conductive layer to form two or more grooves, forming a first sacrificial layer pattern to fill the two or more grooves, forming a cell gate structure by stacking a first inter-layer dielectric layer, a second conductive layer, and another first inter-layer dielectric layer, forming a first channel hole, a second channel hole, a third channel hole, and a fourth channel hole, wherein the first channel hole and the second channel hole expose the first sacrificial layer pattern in one of the grooves, and the third channel hole and fourth channel hole expose the first sacrificial layer pattern in an adjacent groove, forming a first pipe channel hole connecting the lower ends of the first and second channel holes, forming another first pipe channel hole connecting the lower ends of the third and fourth channel holes, and forming a second pipe channel hole connecting the top ends of the second and third channel holes, forming a gate insulation layer along internal walls of the first to fourth channel holes, the two first pipe channel holes, and the second pipe channel hole, forming a first semiconductor layer inside the first to fourth channel holes, the two first pipe channel holes, and the second pipe channel hole, and forming a first line over the second pipe channel hole and electrically coupled to the first semiconductor layer inside the second pipe channel hole.

DESCRIPTION OF SPECIFIC EMBODIMENTS

Figure 1:
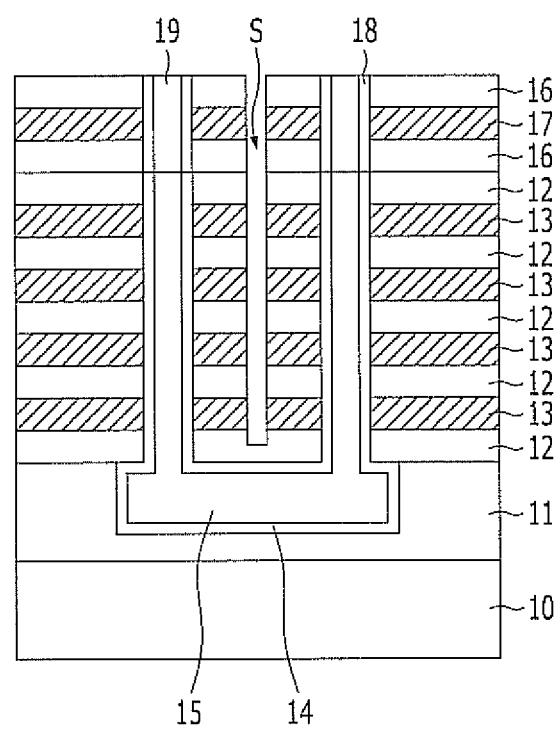
FIG. 1 is a cross-sectional view illustrating a known three-dimensional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 17B are cross-sectional views and plan views illustrating a three-dimensional non-volatile memory device and a fabrication method thereof in accordance with exemplary embodiments of the present invention. B drawings are plan views, while A drawings are cross-sectional views taken along lines X-X' and Y-Y' of the B drawings. In particular, FIGS. 17A and 17B are a cross-sectional view and a plan view illustrating a three-dimensional non-volatile memory device in accordance with an exemplary embodiment of the present invention, and FIGS. 2A to 16B show intermediate processes for fabricating the memory device shown FIGS. 17A and 17B.

First, a method for fabricating a non-volatile memory device in accordance with an exemplary embodiment of the present invention is described with reference to FIGS. 2A to 17B.

Figure 2A:
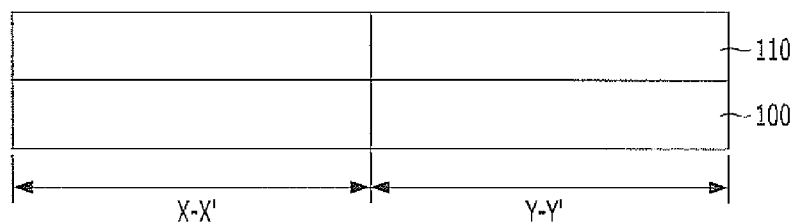
FIGS. 2A to 17B are cross-sectional views and plan views illustrating a three-dimensional non-volatile memory device and a fabrication method thereof in accordance with exemplary embodiments of the present invention.
Figure 2B:
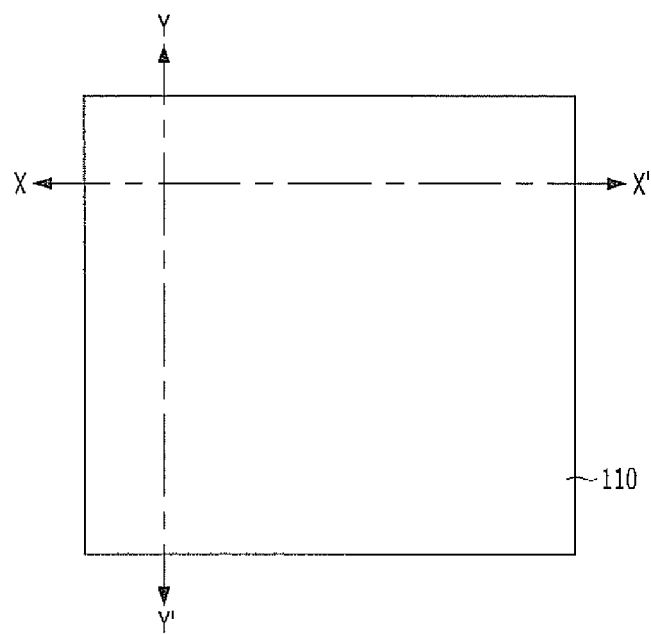

Referring to FIGS. 2A and 2B, a first conductive layer 110 is formed over a substrate 100 to form a gate electrode of a first pipe channel transistor.

The substrate 100 may be a semiconductor substrate such as a silicon substrate.

The first conductive layer 110 may include a polysilicon layer doped with an impurity.

Figure 3A:
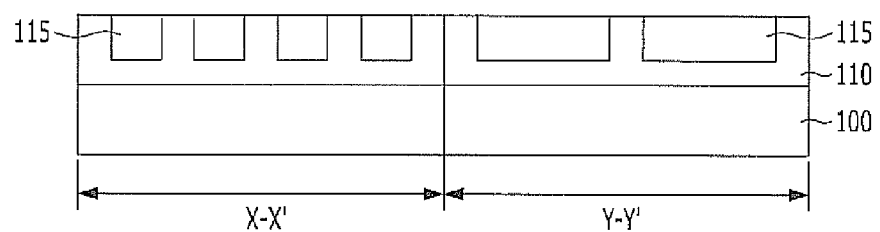
Figure 3B:
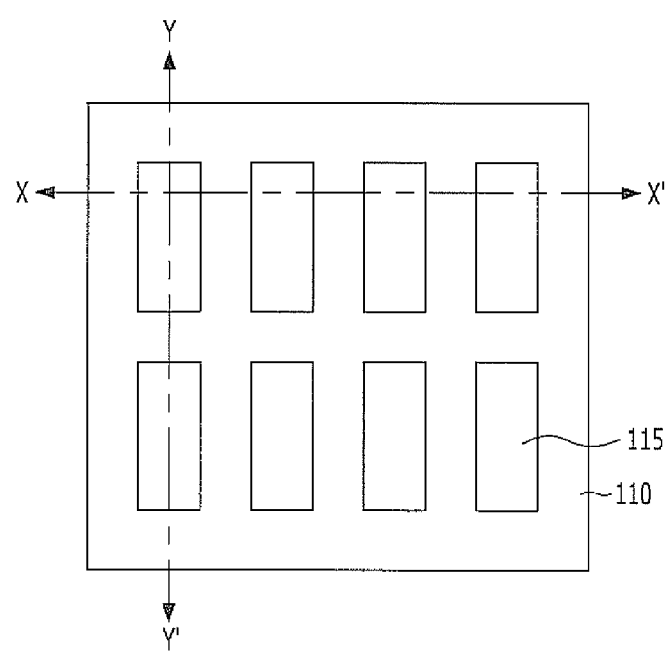

Referring to FIGS. 3A and 3B, a first sacrificial layer pattern 115 filling the inside of the first conductive layer 110 is formed by selectively etching the first conductive layer 110 to form grooves and filling the inside of the grooves with a dielectric material, such as a nitride layer. After filling the grooves with the dielectric material, the resultant structure may be planarized by a planarization process, for example, a Chemical Mechanical Polishing (CMP) process, until portions of the first conductive layer 110 are exposed.

The first sacrificial layer pattern 115 is for forming channel holes of the first pipe channel transistor, which is described later, and the first sacrificial layer pattern 115 has a bar/line shape with a major axis in one direction, e.g., a Y-Y' direction, and a minor axis in a perpendicular direction from the direction of the major axis, e.g., an X-X' direction. Hereafter, for the sake of convenience, the X-X' direction is referred to as a first direction, and the Y-Y' direction is referred to as a second direction. A plurality of first sacrificial layer patterns 115 may be arranged to form an array or matrix with rows and columns in the first and second directions. Two first sacrificial layer patterns 115 that are arrayed adjacent to each other in the second direction (e.g., two first sacrificial layer patterns 115 in the same column) make a pair of first sacrificial layer patterns 115, and may be referred to as a pair of first sacrificial layer patterns. For example, the cross-sectional view taken along Y-Y' in FIG. 3A, shows a pair of first sacrificial layer patterns 115.

Figure 4A:
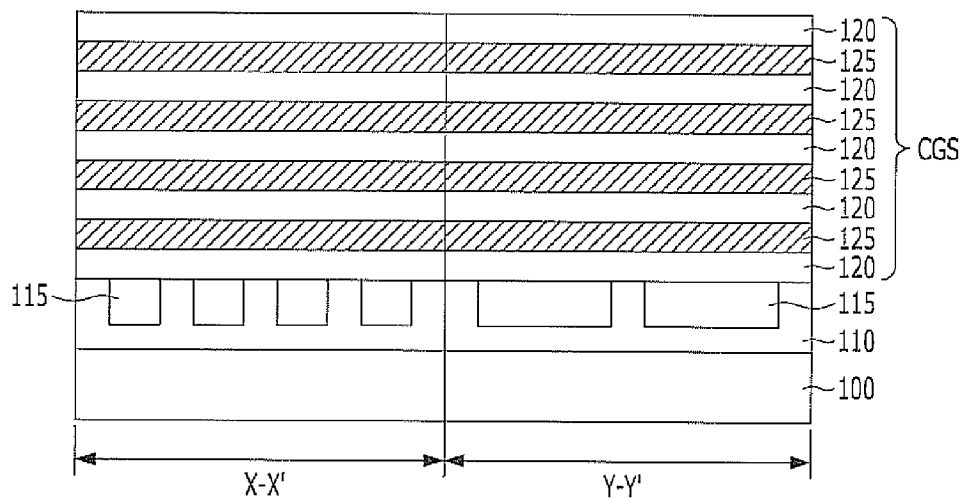
Figure 4B:
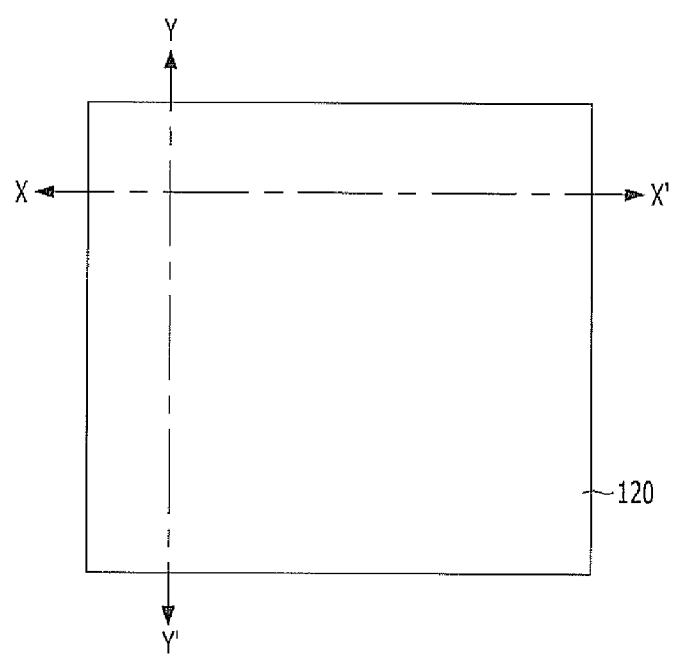

Referring to FIGS. 4A and 4B, first inter-layer dielectric layers 120 and second conductive layers 125 are alternately formed to form a plurality of memory cells that are stacked in a vertical direction over the first sacrificial layer patterns 115 and the first conductive layer 110. Hereafter, for the sake of convenience, the stacked structure where the first inter-layer dielectric layers 120 and the second conductive layers 125 are alternately stacked is referred to as a cell gate structure (CGS).

Herein, the first inter-layer dielectric layers 120 are for isolating the plurality of memory cells from each other. The first inter-layer dielectric layers 120 may be oxide layers. The second conductive layers 125 are used for forming control gate electrodes of the memory cells. The second conductive layers 125 may be polysilicon layers doped with an impurity. In this exemplary embodiment, four layers of the second conductive layers 125 are illustrated, but the present invention is not limited to four layers. On the contrary, any number of layers of the second conductive layers 125 may be formed.

Figure 5A:
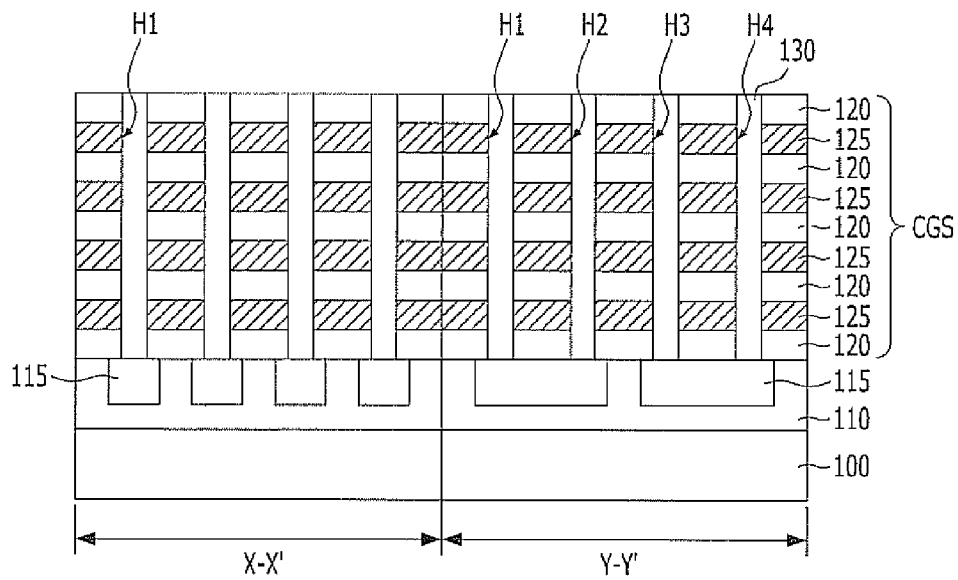
Figure 5B:
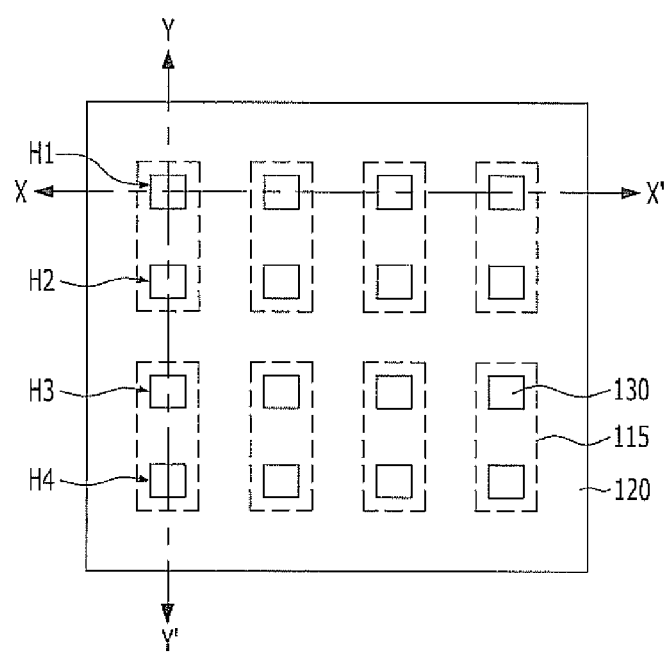

Referring to FIGS. 5A and 5B, a first pair of channel holes, including a first channel hole H1 and a second channel hole H2, which exposes one first sacrificial layer pattern 115 belonging to a pair of first sacrificial layer patterns 115, and a second pair of channel holes, including a third channel hole H3 and a fourth channel hole H4, which exposes the other first sacrificial layer pattern 115 belonging to the same pair of sacrificial layer patterns 115, are formed by selectively etching the cell gate structure. The first to fourth channels holes H1, H2, H3, and H4 are spaces for forming the channels of the memory cells. Also, a pair of channel holes, for example, the first pair of channel holes, including the first channel hole H1 and the second channel hole H2, or the second pair of channel holes, including the third channel hole H3 and the fourth channel hole H4, are disposed over one first sacrificial layer pattern 115 and aligned in the major axis direction, which is the longitudinal direction, of the first sacrificial layer pattern 115.

Subsequently, second sacrificial layer patterns 130 filling the inside of the first to fourth channels holes H1, H2, H3, and H4 are formed. The second sacrificial layer patterns 130 are for protecting the second conductive layers 125 from being damaged during a subsequent process for forming first to third trenches (see FIGS. 6A and 6B). The second sacrificial layer patterns 130 may be a nitride layer. Also, the second scarification layer patterns 130 may be formed by depositing a dielectric material, such as a nitride layer, over the substrate structure including the first to fourth channel holes H1, H2, H3 and H4, and performing a planarization process, for example, a Chemical Mechanical Polishing (CMP) process, until the surface of the cell gate structure is exposed.

Referring to FIG. 5B, the arrangement of the first to fourth channels holes H1, H2, H3, and H4 with respect to the first sacrificial patterns 115 is shown. In FIG. 5B, the first sacrificial layer patterns 115 are shown with dotted lines because they are not visible from the plan view of FIG. 5B. Hereinafter, dotted lines may be used to represent certain structures below the surface visible from the perspective of the plan views.

Figure 6A:
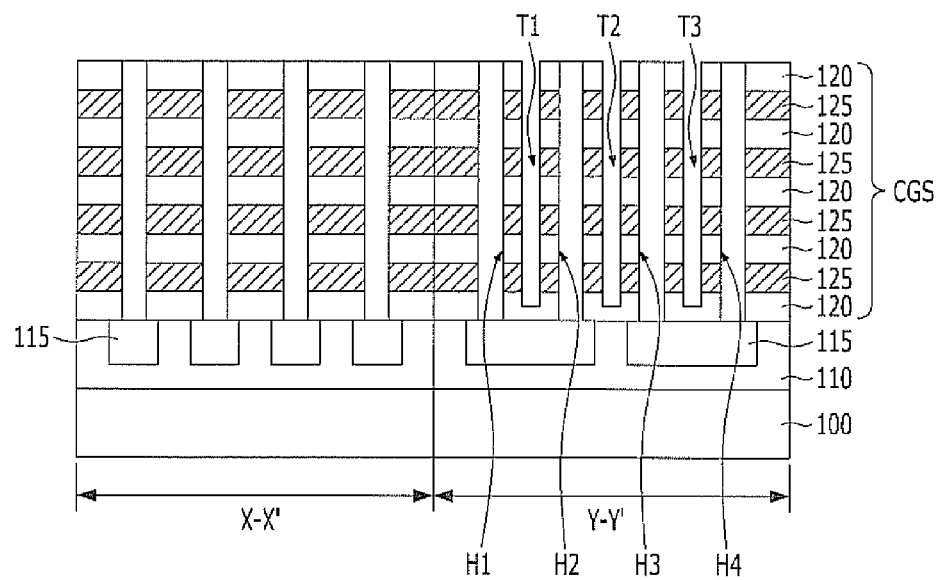
Figure 6B:
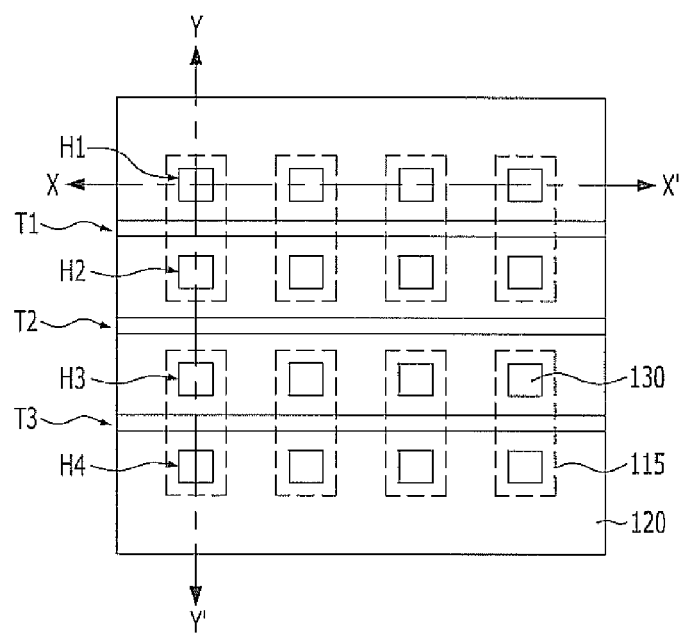

Referring to FIGS. 6A and 6B, slit-type first to third trenches T1, T2 and T3 extending in the first direction are formed in the cell gate structures by selectively etching the cell gate structure between the first channel hole H1 and the second channel hole H2, the cell gate structure between the second channel hole H2 and the third channel hole H3, and the cell gate structure between the third channel hole H3 and the fourth channel hole H4. Herein, the first trench T1 refers to a trench that is disposed between the first pair of channel holes, including the first channel hole H1 and the second channel hole H2, disposed over one first sacrificial layer pattern 115. Meanwhile, the third trench T3 refers to a trench that is disposed between the second pair of channel holes, including the third channel hole H3 and the fourth channel hole H4, disposed over another first sacrificial layer pattern 115. The second trench T2 refers to a trench that is disposed between one first sacrificial layer pattern 115 and another first sacrificial layer pattern 115, that is, between the second channel hole H2 and the third channel hole H3.

Herein, for forming the first to third trenches T1, T2 and T3, the cell gate structures are etched using the lowermost layer of the first inter-layer dielectric layers 120 as an etch stop layer. Particularly, the cell gate structures are over-etched enough to sufficiently isolate the lowermost layer of the second conductive layers 125.

By forming the first to third trenches T1, T2 and T3, the second conductive layers 125 included in the cell gate structures are isolated in the second direction according to each channel hole H1, H2, H3 or H4.

Figure 7A:
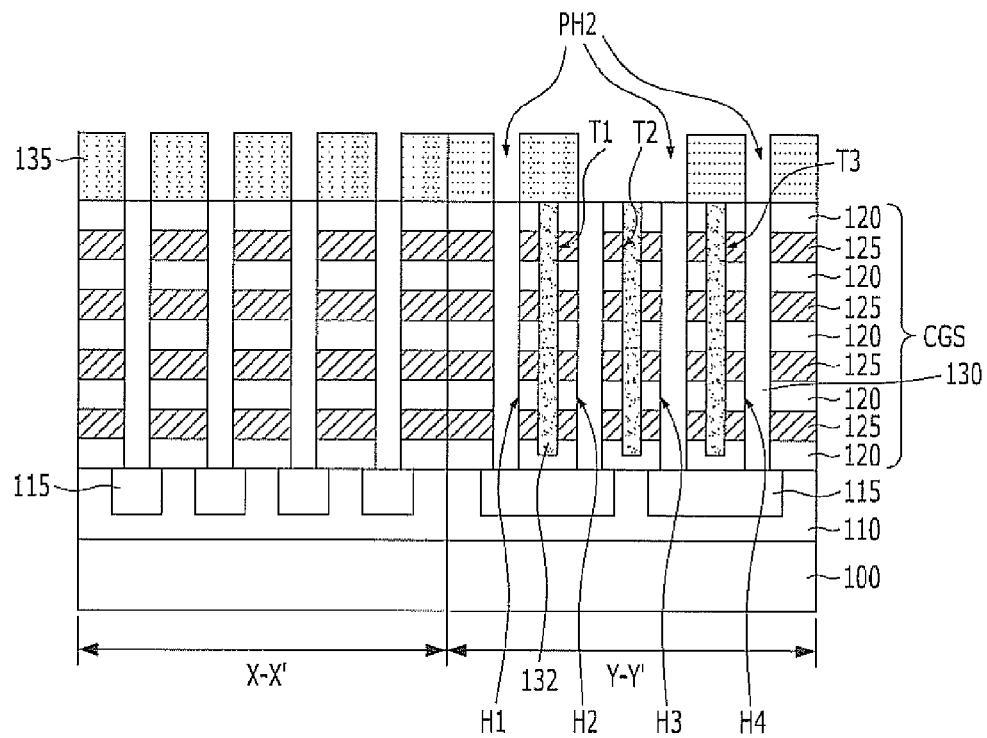
Figure 7B:
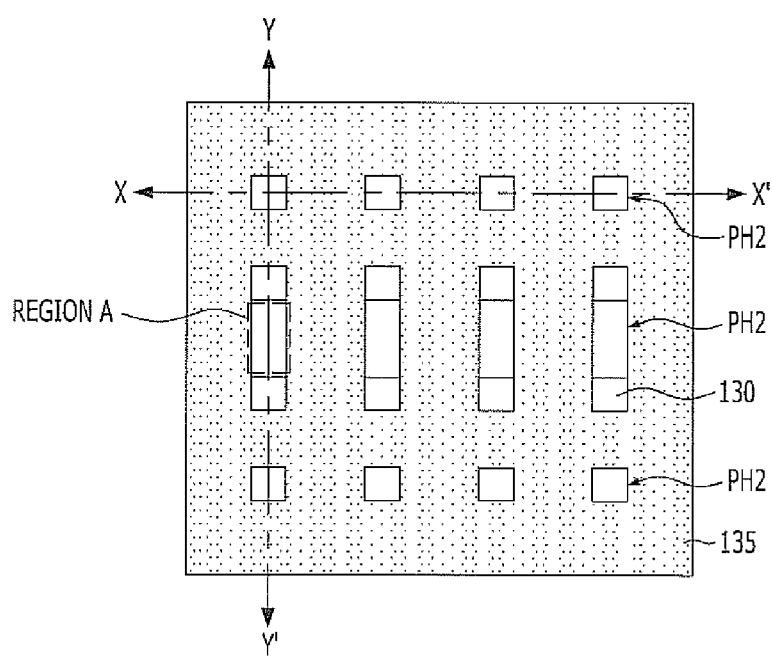

Referring to FIGS. 7A and 7B, third sacrificial layer patterns 132 filling the first to third trenches T1, T2 and T3 are formed.

The third sacrificial layer patterns 132 may be a nitride layer. Also, the third sacrificial layer patterns 132 may be formed by depositing a dielectric material, such as a nitride layer, over the substrate structure including the first to third trenches T1, T2 and T3 and performing a planarization process, e.g., a CMP process, until the surface of the cell gate structures is exposed.

Subsequently, a third conductive layer 135, which forms gate electrodes of second pipe channel transistors, is formed over the cell gate structures including the second sacrificial layer patterns 130 and the third sacrificial layer patterns 132. The third conductive layer 135 may be a polysilicon layer doped with an impurity.

Herein, the third conductive layer 135 includes openings corresponding to the regions where the channels of the second pipe transistors are formed, which are second pipe channel holes PH2. The second pipe channel holes PH2 expose the second sacrificial layer patterns 130. Furthermore, the second pipe channel holes PH2 expose the space (designated by Region A in FIG. 7B) between the second sacrificial layer pattern 130 disposed over one first sacrificial layer pattern 115 and the second sacrificial layer pattern 130 disposed over another first sacrificial layer pattern 115 of the same pair of first sacrificial layer patterns 115. For example, the second pipe channel holes PH2 expose the space (Region A) between the second sacrificial layer pattern 130 filling the second channel hole H2, and the second sacrificial layer pattern 130 filling the third channel hole H3.

Here, the second pipe channel holes PH2 may be formed by etching the third conductive layer 135. The etching of the third conductive layer 135 may be performed using a wet etching process or a dry etching process. Further, a mask may formed over the third conductive layer and used in conjunction with the etching process, so that the etching of the third conductive layer 135 produces the second pipe channel holes PH2. Additionally, once the second pipe channel holes PH2 are formed the mask may be removed.

Figure 8A:
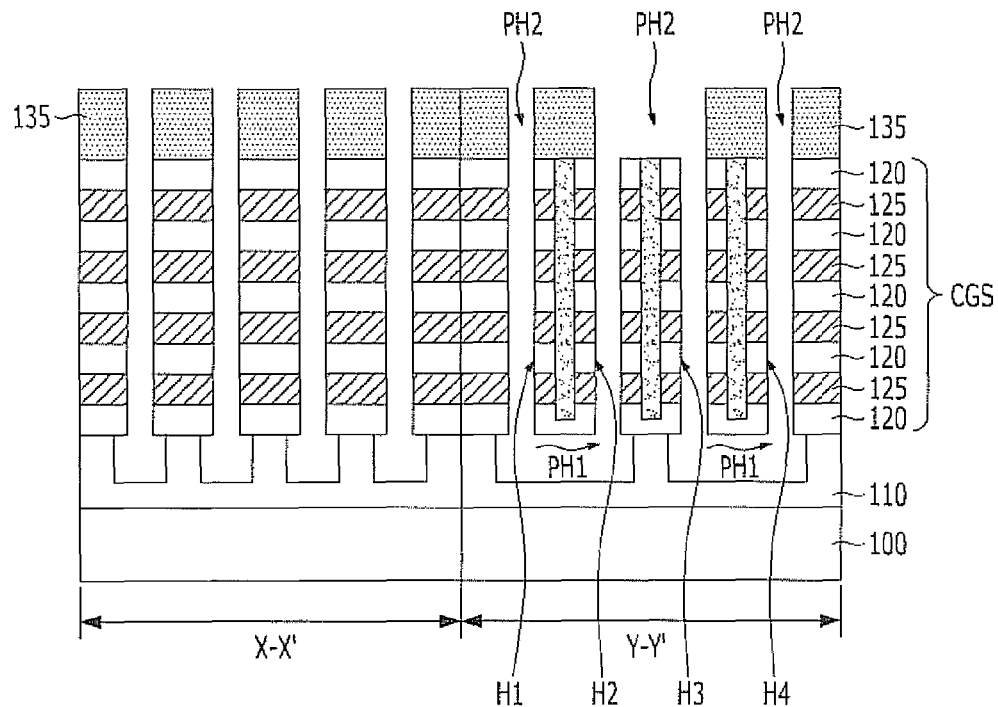
Figure 8B:
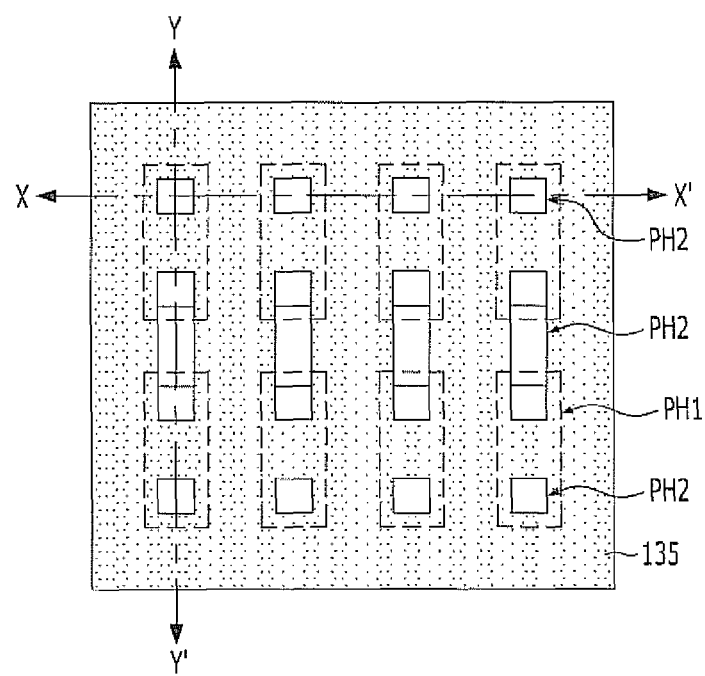

Referring to FIGS. 8A and 8B, the second sacrificial layer pattern 130 exposed by the second pipe channel holes PH2 is removed and the first sacrificial layer pattern 115 exposed by the removal of the second sacrificial layer pattern 130 is removed as well.

The second sacrificial layer pattern 130 and the first sacrificial layer pattern 115 may be removed through a wet-etch process. When the second sacrificial layer pattern 130 and the first sacrificial layer pattern 115 are nitride layers, the wet-etch process may be performed using an etch solution, including phosphoric acid and/or the like.

As a result, the second sacrificial layer pattern 130 is removed and the first to fourth channel holes H1, H2, H3, and H4 are opened. Also, as the first sacrificial layer pattern 115 is removed, the space for forming the channel of a first pipe channel transistor, which is a first pipe channel hole PH1, is formed.

As shown in FIG. 8A, as a result of the above process, the first channel hole H1 and the second channel hole H2 are physically connected with each other through one of the first pipe channel holes PH1 disposed under the first channel hole H1 and the second channel hole H2, and the third channel hole H3 and the fourth channel hole H4 are physically connected with each other through another first pipe channel hole PH1 disposed under the third channel hole H3 and the fourth channel hole H4. The second channel hole H2 and the third channel hole H3 are connected to each other through the second pipe channel holes PH2 disposed over the second channel hole H2 and the third channel hole H3. In short, the first to fourth channel holes H1, H2, H3 and H4, the first pipe channel hole PH1, and the second pipe channel holes PH2 are connected to each other.

Figure 9A:
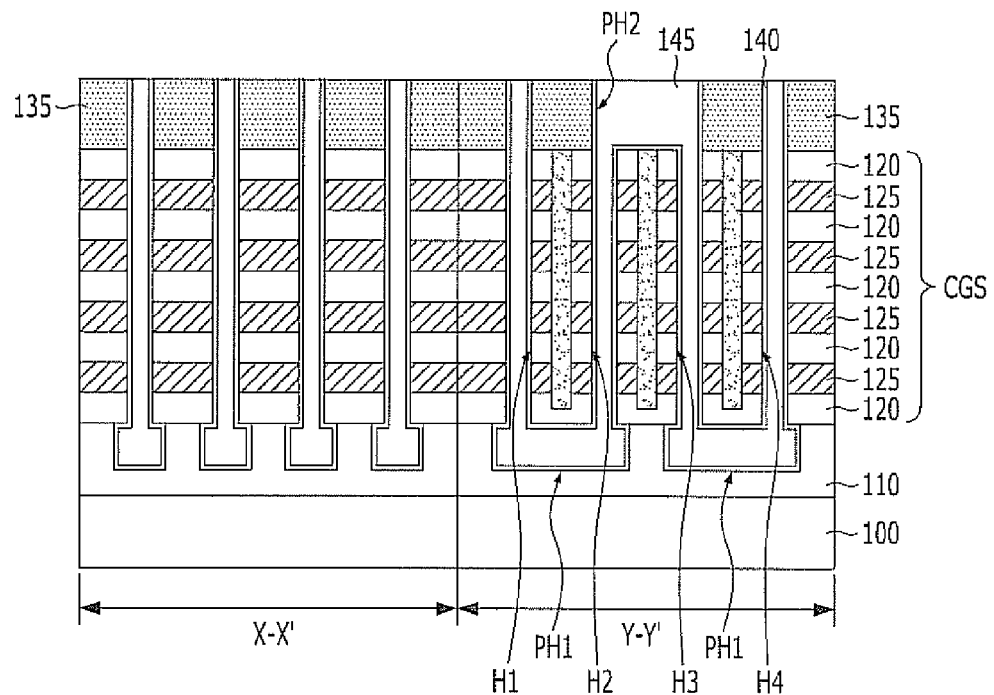
Figure 9B:
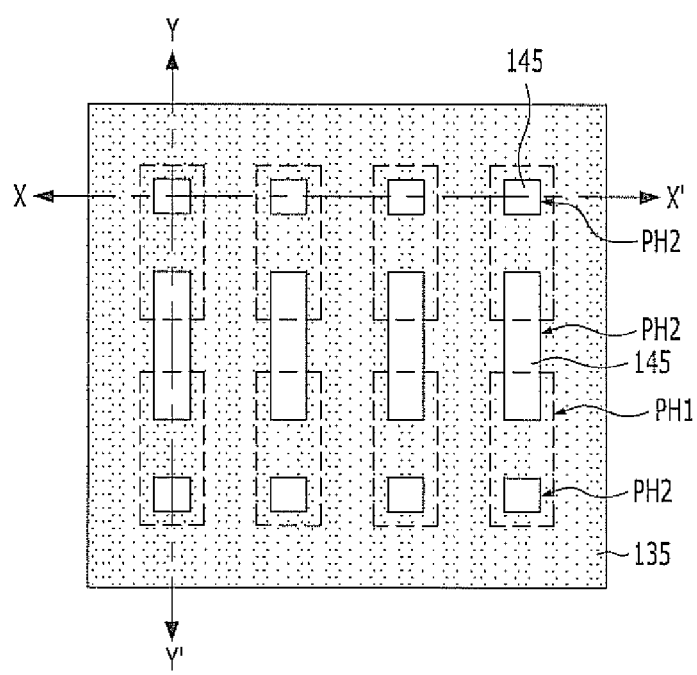

Referring to FIGS. 9A and 9b, a memory gate insulation layer 140 is formed along the internal walls of the first to fourth channel holes H1, H2, H3 and H4, the first pipe channel hole PH1, and the second pipe channel holes PH2. A first semiconductor layer 145 to be used as the channels of the memory cells and the channels of the first and second pipe channel transistors is formed over the memory gate insulation layer 140.

The memory gate insulation layer 140 may be formed by sequentially depositing a charge blocking layer, a charge trapping layer, and a tunnel insulation layer. Herein, the tunnel insulation layer, which is a layer for charge tunneling, may be an oxide layer, and the charge trapping layer, which is a layer for trapping charges and storing a data, may be a nitride layer. Further, the charge blocking layer, which is a layer for preventing charge inside the charge trapping layer from transferring to the outside, may be an oxide layer. In short, the memory gate insulation layer 140 may have a triple layer structure of oxide-nitride-oxide (ONO).

The memory gate insulation layer 140 may electrically isolate the second conductive layers 125 and the first semiconductor layer 145 from each other and substantially store data by trapping charges between the second conductive layers 125 and the first semiconductor layer 145 that are respectively used as the gate electrode and channel of the memory cell. Also, the memory gate insulation layer 140 may serve as a gate insulation layer which insulates the first conductive layer 110 and the first semiconductor layer 145 from each other between the first conductive layer 110 and the first semiconductor layer 145 which are respectively used as the gate electrode and channel of a first pipe channel transistor. Also, the memory gate insulation layer 140 may serve as a gate insulation layer which insulates the third conductive layer 135 and the first semiconductor layer 145 from each other between the third conductive layer 135 and the first semiconductor layer 145 which are respectively used as the gate electrode and channel of a second pipe channel transistor.

The first semiconductor layer 145 may be formed by depositing a semiconductor material, such as polysilicon, along the memory gate insulation layer 140. Herein, the first semiconductor layer 145 may be of a first conductivity type, for example, it may be of a P-type.

In this embodiment, the first semiconductor layer 145 is formed to have a thickness filling the first pipe channel hole PH1, the second pipe channel holes PH2, and the first to fourth channel holes H1, H2, H3 and H4. However, the present invention is not limited to an embodiment wherein the first semiconductor layer 145 fills these holes. According to another exemplary embodiment, the first semiconductor layer 145 may be formed to be a thin layer, which does not fill the first pipe channel hole PH1, the second pipe channel holes PH2, and the first to fourth channel holes H1, H2, H3 and H4.

As shown in FIG. 9A, as a result of forming the first semiconductor layer 145, the first semiconductor layer 145 includes first to fourth pillar portions that are respectively formed in the inside of the first to fourth channel holes H1, H2, H3 and H4 in a pillar shape, a first connection portion formed inside of the first pipe channel hole PH1 and connecting the lower portions of the first and second pillar portions, a second connection portion formed inside of the first pipe channel hole PH1 and connecting the lower portions of the third and the fourth pillar portions, fifth and sixth pillar portions that are formed inside of the second pipe channel holes PH2 and respectively disposed over the first and fourth pillar portions, and a third connection portion formed inside of the second pipe channel hole PH2 and connecting the upper portions of the second and third pillar portions. Herein, the first to fourth pillar portions may be used as the channel of a memory cell, and the first and second connection portions may be used as the channel of the first pipe channel transistor. The third connection portion, the fifth pillar portion, and the sixth pillar portion may be used as the channel of the second pipe channel transistor.

As a result of the process, the first pipe channel transistor, including the first and second connection portions of the first semiconductor layer 145, the first conductive layer 110 surrounding the side surfaces and the lower surfaces of the first and second connection portions, and the memory gate insulation layer 140 interposed between the first and second connection portions and the first conductive layer 110, is formed over the substrate 100.

Over the first pipe channel transistor, a plurality of layers of memory cells, including the first to fourth pillar portions of the first semiconductor layer 145, a plurality of second conductive layers 125 which are stacked along the first to fourth pillar portions and isolated by the aforementioned first to third trenches T1, T2 and T3 according to each of the first to fourth pillar portions, and the memory gate insulation layer 140 interposed between the first to fourth pillar portions and the second conductive layers 125, are formed. Hereafter, the multiple layers of memory cells which are stacked along each of the first to fourth pillar portions are referred to as first to fourth vertical strings. Each of the first to fourth vertical strings include four layers of memory cells as shown in the exemplary embodiment of FIG. 9A, but the present invention is not limited to four layers of memory cells in each of the vertical strings. On the contrary, any number of layers may be in each of the vertical strings. Since the first to fourth vertical strings are coupled by the first to third connection portions, the first to fourth vertical strings are connected in series to form one memory string. According to this exemplary embodiment, one memory string therefore may include 16 memory cells.

Over the multiple layers of memory cells, a second pipe channel transistor, including the fifth and sixth pillar portions and the third connection portion of the first semiconductor layer 145, the third conductive layer 135 surrounding the side surfaces of the fifth and sixth pillar portions and the third connection portion, and the memory gate insulation layer 140 interposed between the third connection portion and the fifth and sixth pillar portions and the third conductive layer 135, is formed.

The connection of the first to fourth vertical strings may be controlled by the first and second pipe channel transistors. In short, the connection of the first and second vertical strings and the connection of the third and fourth vertical strings may be controlled by the first pipe channel transistor, while the connection of the second and third vertical strings may be controlled by the second pipe channel transistor.

Figure 10A:
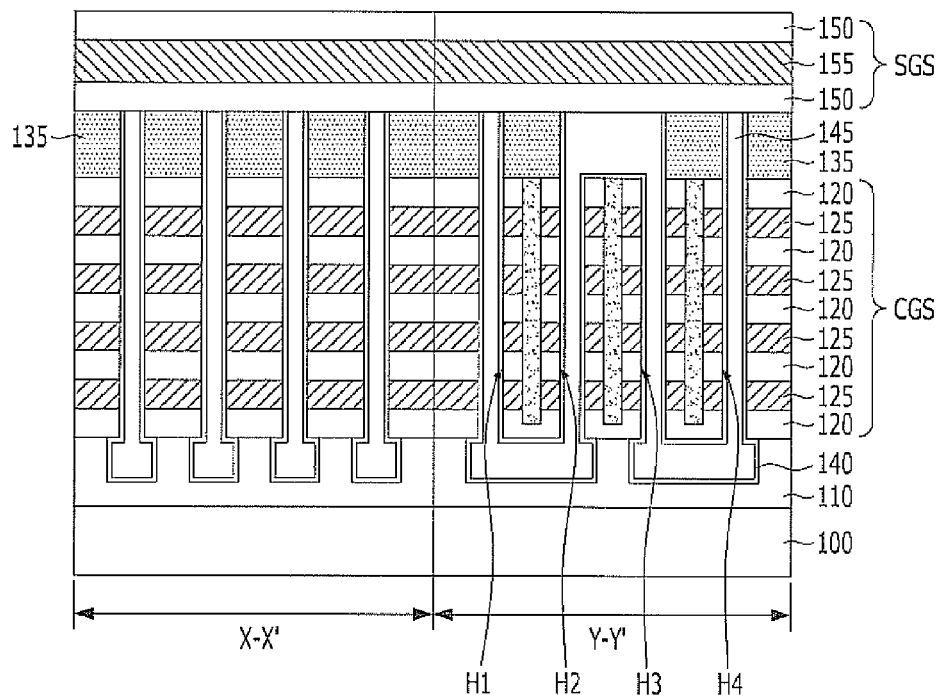
Figure 10B:
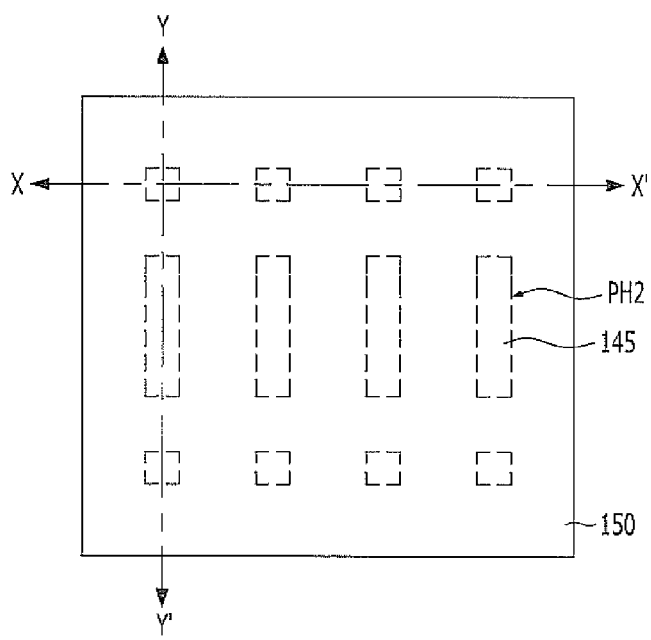

Referring to FIGS. 10A and 10B, a second inter-layer dielectric layer 150, a fourth conductive layer 155, and the second inter-layer dielectric layer 150 are sequentially formed over the resultant substrate structure of the processes of FIGS. 9A and 9B in order to form the first and second selection transistors. Hereafter, for the sake of convenience, the stacked structure of the second inter-layer dielectric layer 150, the fourth conductive layer 155, and the second inter-layer dielectric layer 150 is referred to as a selection gate structure (SGS).

The fourth conductive layer 155 is for forming the gate electrodes of the first and second selection transistors. The fourth conductive layer 155 may be a polysilicon layer doped with an impurity. The second inter-layer dielectric layer 150 insulates the fourth conductive layer 155 from the upper and lower structures of the fourth conductive layer 155, and the second inter-layer dielectric layer 150 may be an oxide layer.

Figure 11A:
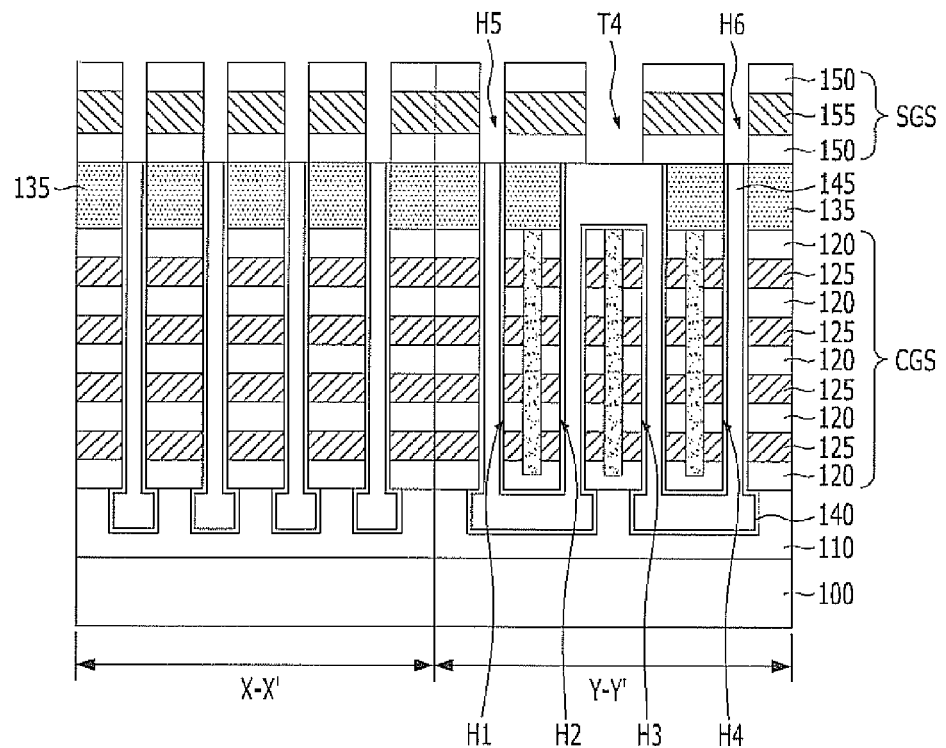
Figure 11B:
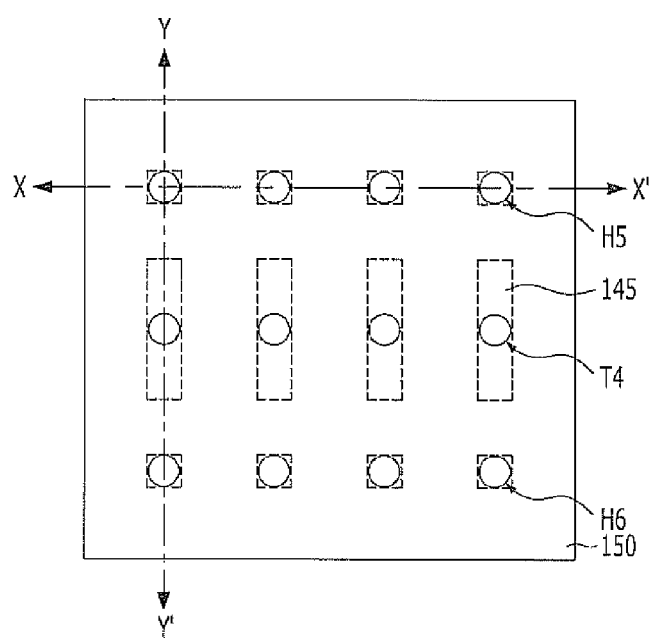

Referring to FIGS. 11A and 11B, a fifth channel hole H5 which exposes the fifth pillar portion of the first semiconductor layer 145 and a sixth channel hole H6 which exposes the sixth pillar portion of the first semiconductor layer 145 are formed by selectively etching the selection gate structure (SGS). The fifth and sixth channel holes H5 and H6 are the regions where the channels of the first and second selection transistors are to be formed.

A fourth trench T4 which exposes the third connection portion of the first semiconductor layer 145 is formed by selectively etching the selection gate structure (SGS). The fourth trench T4 may expose the region over the third connection portion between the second pillar portion inside the second channel hole H2 and the third pillar portion inside the third channel hole H3. The fourth trench T4 is the region where a fourth semiconductor layer, which will be described later, is to be formed. Although the fourth trench T4 is illustrated as having a hole shape in this exemplary embodiment, the present invention is not limited to the hole shape. According to another exemplary embodiment, the fourth trench T4 may have a line shape extending in the first direction, and still expose the third connection portion.

Figure 12A:
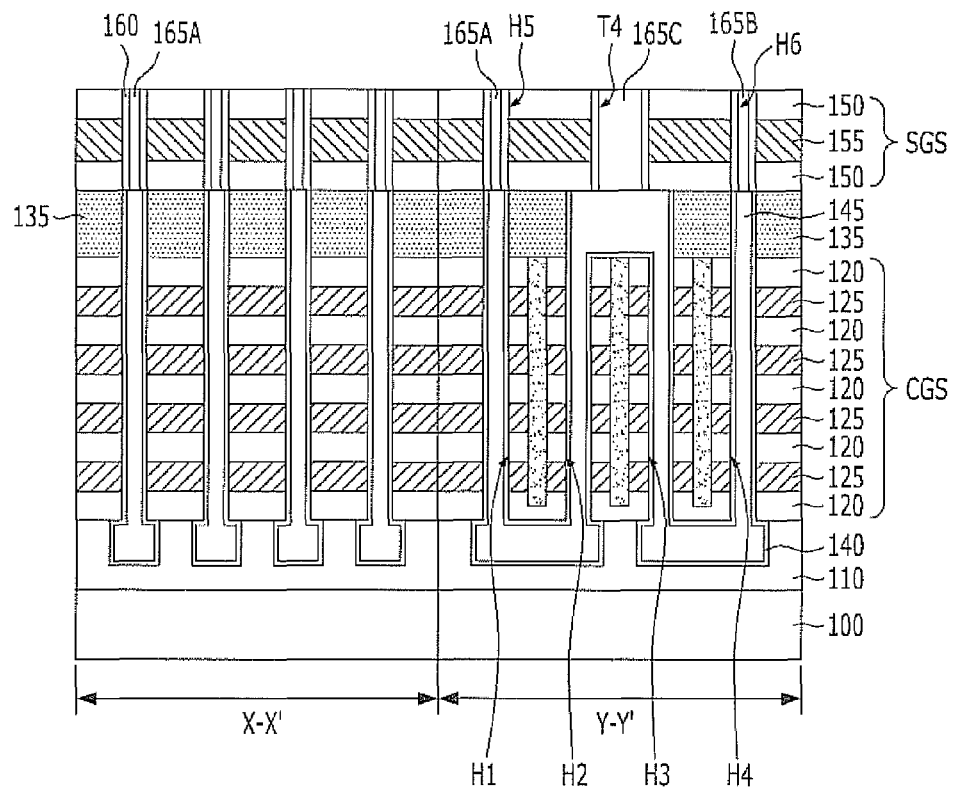
Figure 12B:
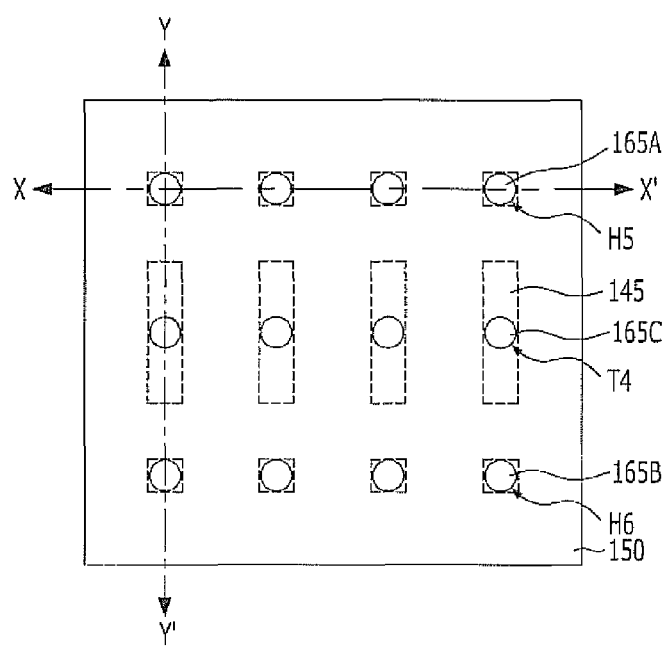

Referring to FIGS. 12A and 12B, a gate insulation layer 160 is formed on the sidewalls of the fourth trench T4, the fifth channel hole H5, and the sixth channel hole H6, and then semiconductor layers 165A, 165B and 165C respectively filling the inside of the fifth channel hole H5, the sixth channel hole H6, and the fourth trench T4 with the gate insulation layer 160 formed therein are formed. The semiconductor layers 165A, 165B and 165C may be formed by depositing a semiconductor material such as polysilicon over the substrate structure including the fifth channel hole H5, the sixth channel hole H6, and the fourth trench T4 and performing a planarization process, e.g., a CMP process. Hereafter, the semiconductor layers filling the fifth channel hole H5, the sixth channel hole H6, and the fourth trench T4 are referred to as second to fourth semiconductor layers 165A, 165B and 165C, respectively. The second to fourth semiconductor layers 165A, 165B and 165C may have the same conductivity type as the first semiconductor layer 145, which is the first conductivity type. For example, the first conductivity type may be a P type.

Herein, the second and third semiconductor layers 165A and 165B filling the fifth channel hole H5 and the sixth channel hole H6 may be used as the channels for the first and second selection transistors.

Also, the fourth semiconductor layer 165C filling the fourth trench T4 may function as a node that may apply a certain voltage (e.g., a predetermined voltage) to the first semiconductor layer 145 by being directly coupled with the first semiconductor layer 145, which is used as the channel of the memory string. In other words, the fourth semiconductor layer 165C may function as a substrate body where a well pickup region is formed. Therefore, an operation of erasing a data may be performed by applying an erase voltage to the fourth semiconductor layer 165C. As described above, when the conductivity type of the fourth semiconductor layer 165C is a P type, and the fourth semiconductor layer 165C includes a P-type impurity doped in a higher concentration than the first semiconductor layer 145, the fourth semiconductor layer 165C makes it possible to perform an F-N tunneling erase operation by supplying holes to the first semiconductor layer 145 during an erase operation in which data stored in a plurality of memory cells are erased.

The gate insulation layer 160 is interposed between the second and third semiconductor layers 165A and 165B and the fourth conductive layer 155 and between the fourth semiconductor layer 165C and the fourth conductive layer 155 to electrically insulate them from each other.

Figure 13A:
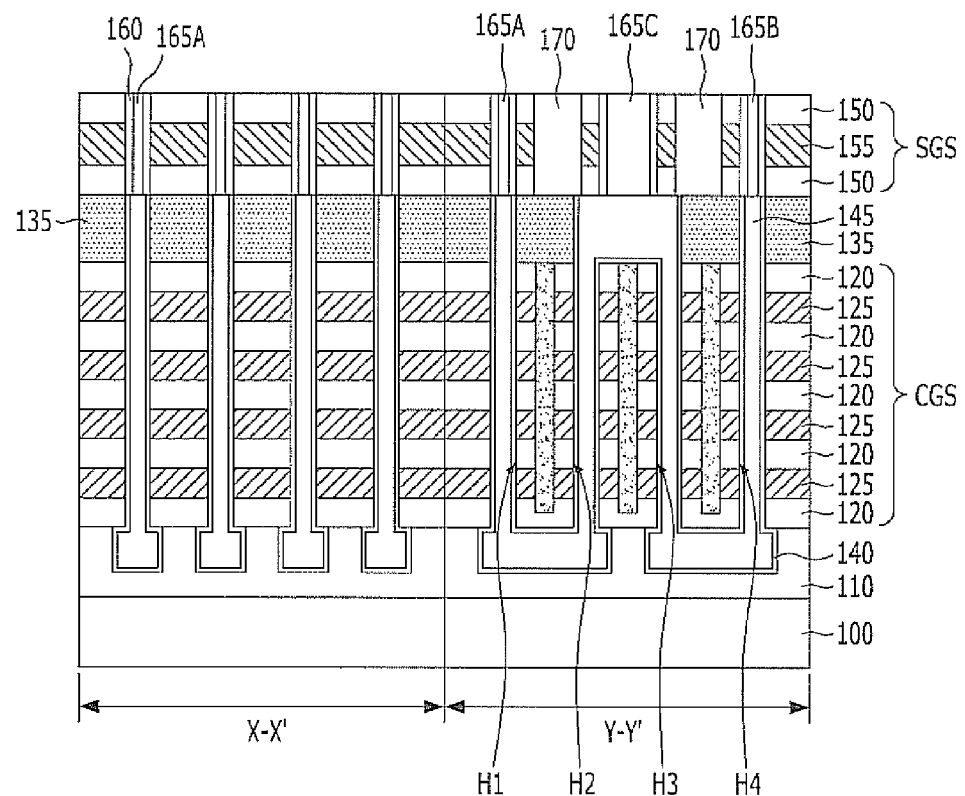
Figure 13B:
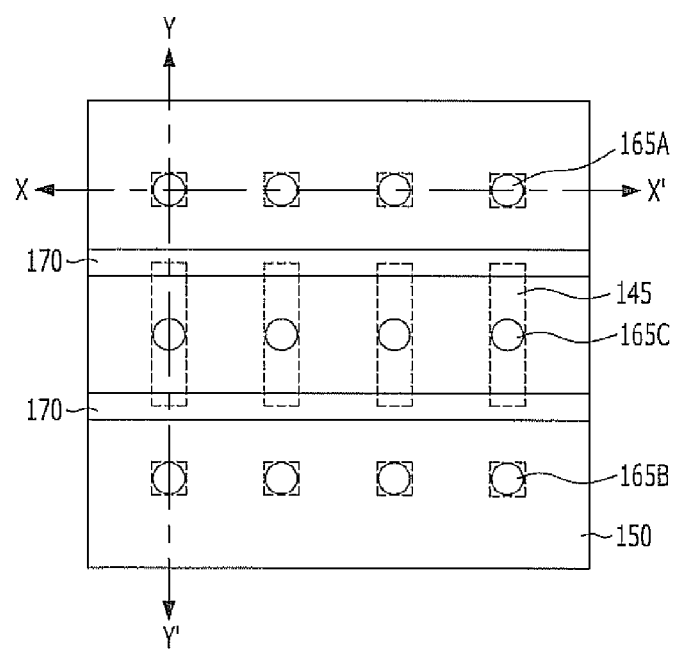

Referring to FIGS. 13A and 13B, in order to isolate the first and second selection transistors from the fourth semiconductor layer 165C, a trench extending in the first direction is formed by selectively etching the selection gate structures (SGS) between the second semiconductor layer 165A and the fourth semiconductor layer 165C and between the third semiconductor layer 165B and the fourth semiconductor layer 165C, and then a first insulation layer 170 filling the trench is formed. As a result, the first insulation layer 170 has a line shape extending in the first direction and is disposed inside of the selection gate structures (SGS) between the second semiconductor layer 165A and the fourth semiconductor layer 165C and between the third semiconductor layer 165B and the fourth semiconductor layer 165C.

As a result of the processes above, the first selection transistor and a second selection transistor are disposed over the second pipe channel transistor. The first selection transistor is coupled with one end of the memory string and includes the second semiconductor layer 165A, the fourth conductive layer 155 extending in the first direction while surrounding the sidewalls of the second semiconductor layer 165A, and the gate insulation layer 160 interposed between the second semiconductor layer 165A and the fourth conductive layer 155. The second selection transistor is coupled with the other end of the memory string and includes the third semiconductor layer 165B, the fourth conductive layer 155 extending in the first direction while surrounding the sidewalls of the third semiconductor layer 165B, and the gate insulation layer 160 interposed between the third semiconductor layer 165B and the fourth conductive layer 155. The fourth semiconductor layer 165C is disposed between the first selection transistor and the second selection transistor. Moreover, the first selection transistor, the second selection transistor, and the fourth semiconductor layer 165C are isolated from each other by the first insulation layer 170.

Hereafter, for the sake of convenience, the first selection transistor is referred to as a drain selection transistor, and the second selection transistor is referred to as a source selection transistor. According to another exemplary embodiment, however, the first selection transistor is referred to as a source selection transistor, and the second selection transistor is referred to as a drain selection transistor.

Figure 14A:
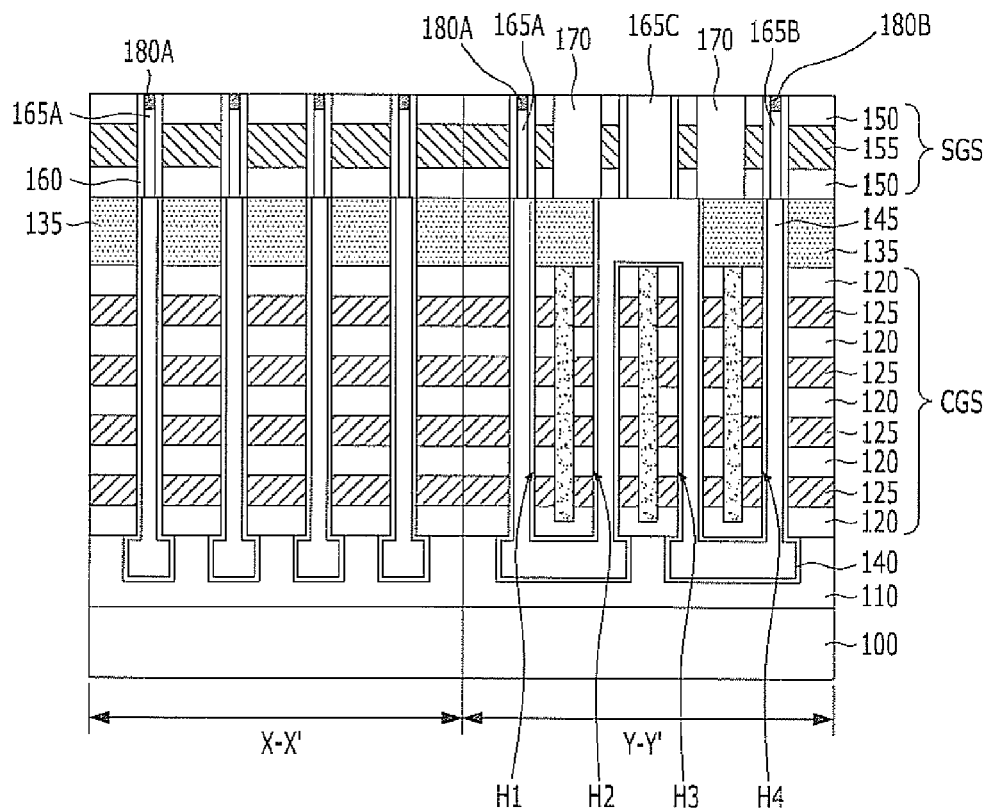
Figure 14B:
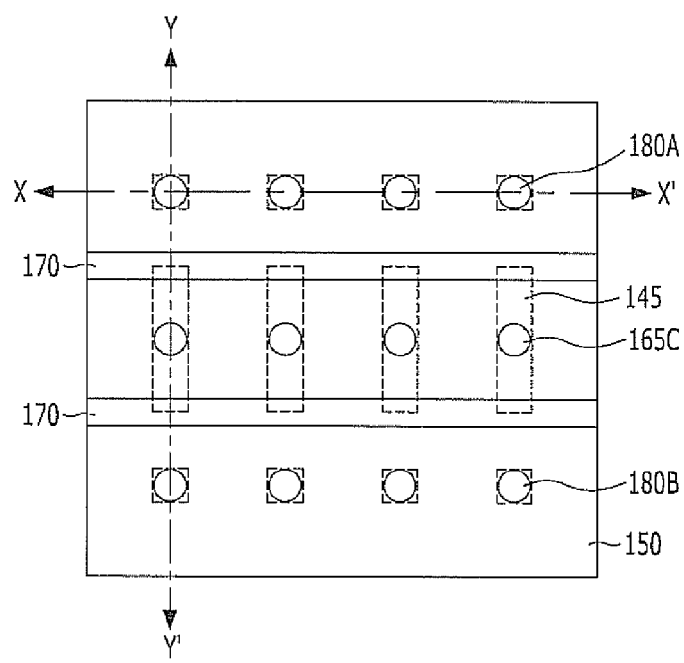

Referring to FIGS. 14A and 14B, a first junction region 180A and a second junction region 180B are formed in the upper portions of the second and third semiconductor layers 165A and 165B, which are used as the channels of the first and second selection transistors, by selectively doping the second and third semiconductor layers 165A and 165B with an impurity. The first junction region 180A is a drain region and the second junction region 180B is a source region in this exemplary embodiment, but the present invention is not limited to this arrangement. In another embodiment, the drain and source regions may be switched.

Herein, the first junction region 180A and the second junction region 180B may be of a second conductivity type, which is opposite to the conductivity type of the first semiconductor layer 145 and the fourth semiconductor layer 165C. For example, where the conductivity type of the first semiconductor layer 145 is a P-type, the second conductivity type may be an N type.

Figure 15A:
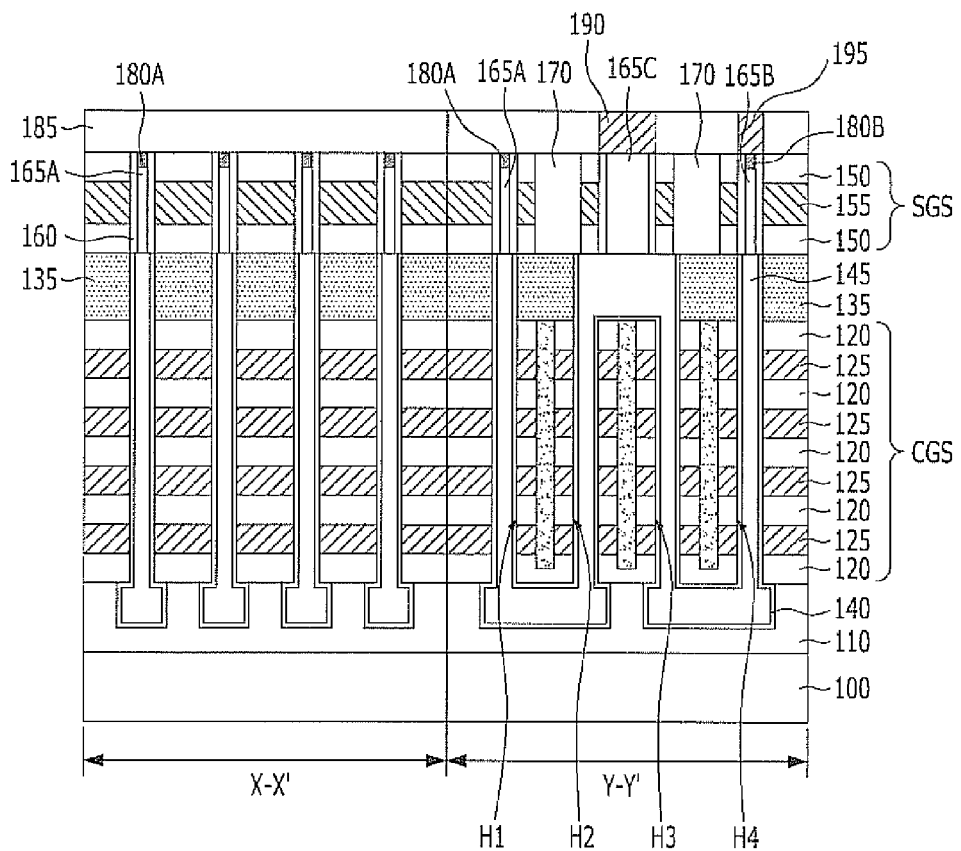
Figure 15B:
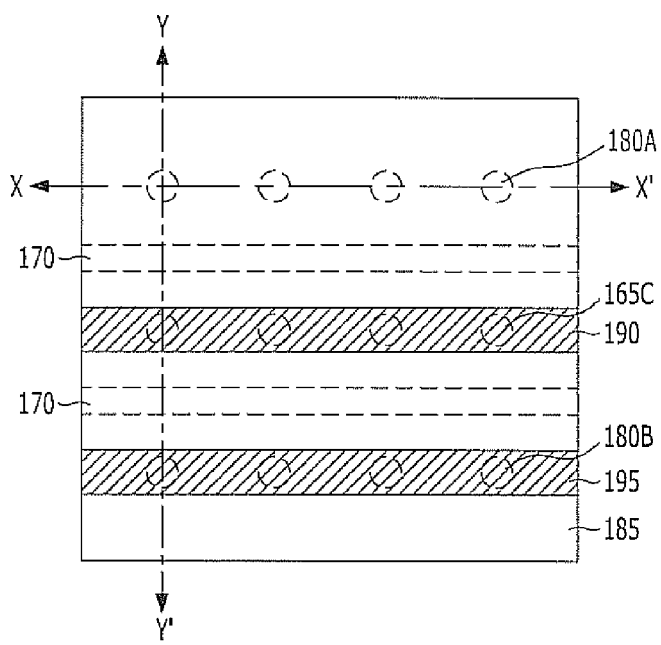

Referring to FIGS. 15A and 15B, a second insulation layer 185 covering the substrate structure obtained after the processes of FIGS. 14A and 14B is formed. Then, trenches extending in the first direction while exposing the third and fourth semiconductor layers 165B and 165C are formed by selectively etching the second insulation layer 185. Subsequently, a first line 190 and a second line 195 are formed by filling the inside of the trenches with a conductive material. Accordingly, the first line 190 extends in the first direction and connects the fourth semiconductor layer 165C that is aligned in the first direction (i.e., connects portions of the fourth semiconductor layer 165C within the same row). Meanwhile, the second line 195 extends in the first direction and connects the second junction region 180B in the upper portion of the third semiconductor layer 165B that is aligned in the first direction (i.e., connects portions of the second junction region 180B within the same row).

Herein, the first line 190 may be a line for applying a body voltage to the fourth semiconductor layer 165C, which functions as a substrate body, and particularly, the first line 190 may be a line for applying an erase voltage used for the aforementioned erase operation. The erase voltage is a relatively high voltage. For example, the erase voltage may range from approximately 10 V to approximately 25 V.

The second line 195 is a line coupled with the second junction region 180B. When the second junction region 180B is a source region, the second line 195 may be a source line.

Figure 16A:
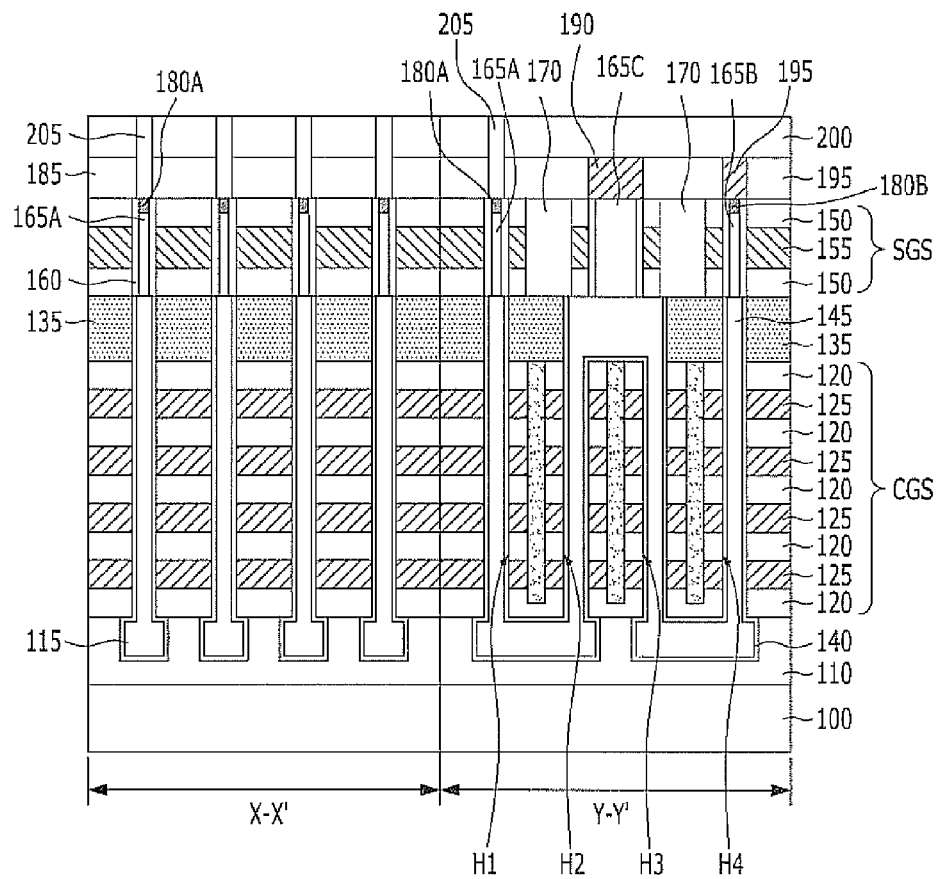
Figure 16B:
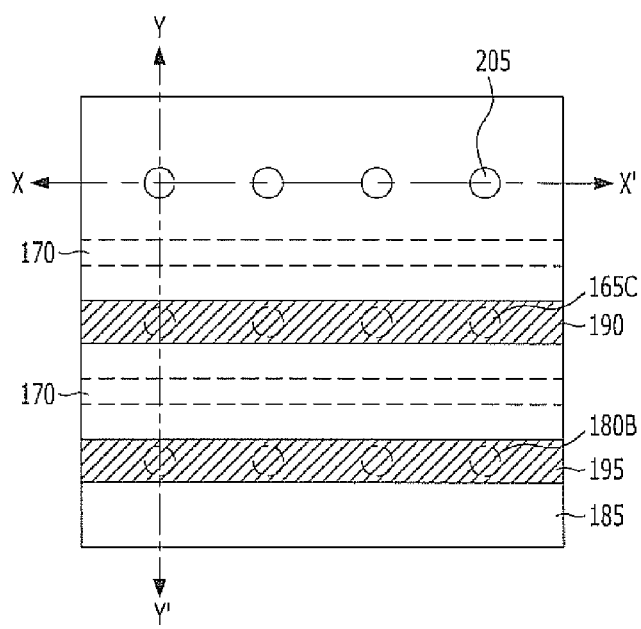
Figure 17A:
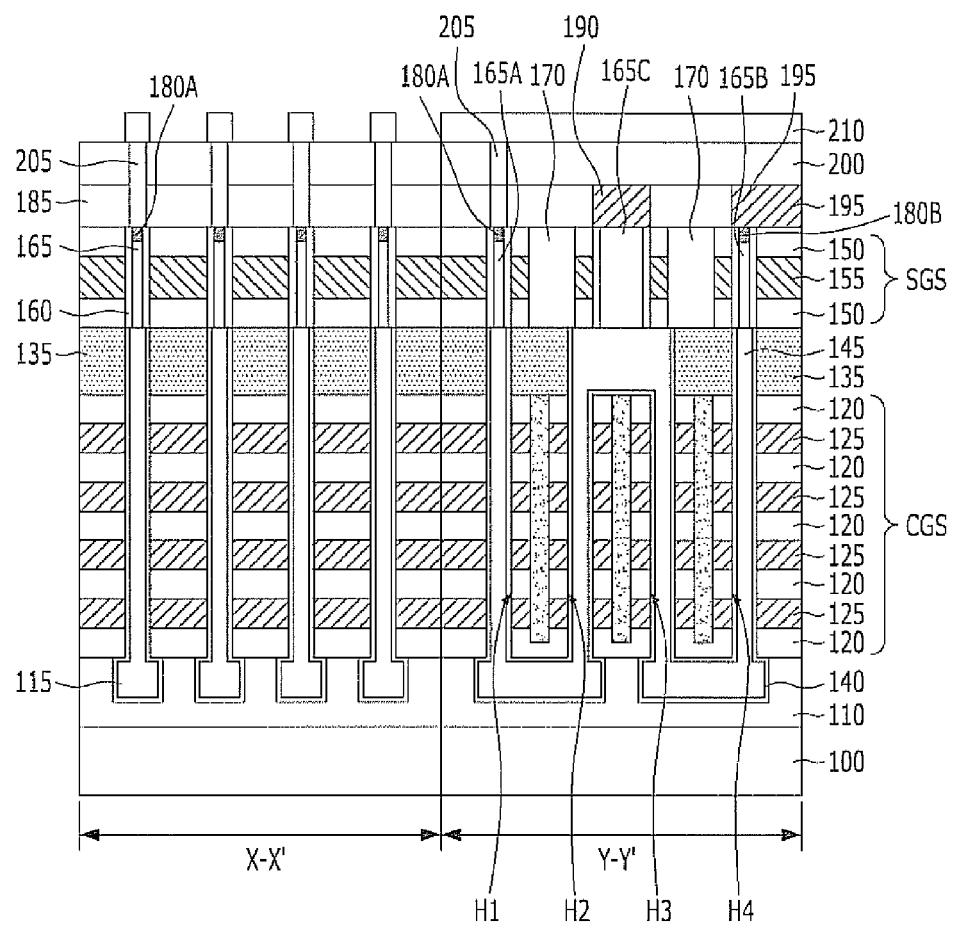
Figure 17B:
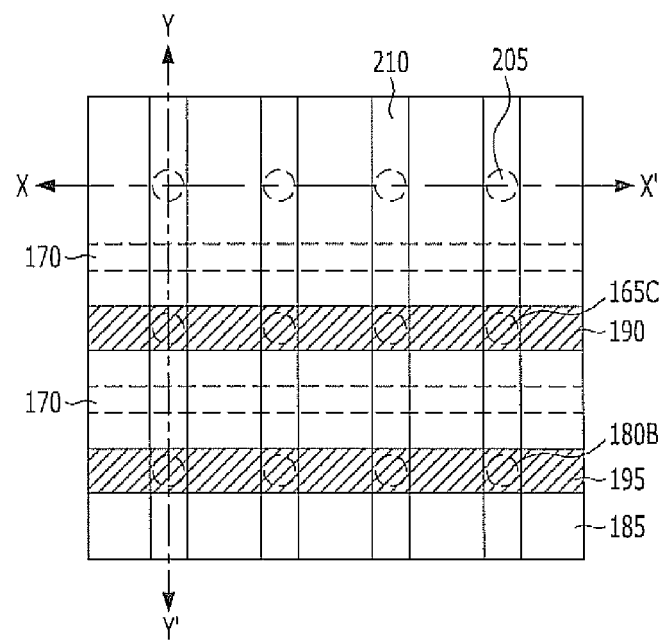

Referring to FIGS. 16A and 16B, a third insulation layer 200 covering the substrate structure obtained from the processes of FIGS. 15A and 15B is formed. Then, a contact hole which exposes the first junction region 180A in the upper portion of the second semiconductor layer 165A is formed by selectively etching the third insulation layer 200. Subsequently, a contact 205 electrically connected to the first junction region 180A is formed by filling the inside of the contact hole with a conductive material. When the first junction region 180A is a drain region, the contact 205 may be a drain contact.

Referring to FIGS. 17A and 17B, a third line 210 extending in the second direction and coupled with the contact 205 is formed over the third insulation layer 200. When the contact 205 is a drain contact, the third line 210 may be a bit line.

Hereafter, referring to FIGS. 17A and 17B again, the non-volatile memory device in accordance with an exemplary embodiment of the present invention is described. The non-volatile memory device may be fabricated according to the processes described with reference to FIGS. 2A to 16B. However, the present invention is not limited to these processes, and the non-volatile memory device may be fabricated through other processes. Since the constituent elements and functions of the non-volatile memory device have been described above, the non-volatile memory device according to FIGS. 17A and 17B is described briefly.

Referring to FIGS. 17A and 17B, the non-volatile memory device includes: the substrate 100; the memory string disposed over the substrate 100 and including the first semiconductor layer 145 and a plurality of the second conductive layers 125 contacting the first semiconductor layer 145 with the memory gate insulation layer 140 between them; the first selection transistor coupled with one end of the memory string and including the second semiconductor layer 165A and the fourth conductive layer 155 contacting the second semiconductor layer 165A with the gate insulation layer 160 between them; the second selection transistor coupled with the other end of the memory string and including the third semiconductor layer 165B and the fourth conductive layer 155 contacting the third semiconductor layer 165B with the gate insulation layer 160 between them; and the fourth semiconductor layer 165C disposed between a first selection transistor and the second selection transistor and coupled with the first semiconductor layer 145.

To be specific, the first semiconductor layer 145 may include the first to fourth pillar portions which are respectively formed in the first to fourth channel holes H1, H2, H3 and H4 and aligned in the second direction and which extend perpendicularly to the substrate 100, the fist connection portion connecting the lower portions of the first and second pillar portions to each other, the second connection portion connecting the lower portions of the third and fourth pillar portions to each other, and the third connection portion connecting the upper portions of the second and third pillar portions to each other. The first and second connection portions may be formed inside of the first pipe channel holes PH1, and the third connection portion may be formed inside of the second pipe channel hole PH2. Also, the fifth and sixth pillar portions that are formed inside of the second pipe channel hole PH2 may be disposed over the first and fourth pillar portions.

The memory gate insulation layer 140 may be disposed to surround the sides of the first to fourth pillar portions. Furthermore, the memory gate insulation layer 140 may be disposed to surround the first to third connection portions and the fifth and sixth pillar portions.

The multiple second conductive layers 125 may extend in the first direction while surrounding the sides of the first to fourth pillar portions with the memory gate insulation layer 140 between them and may be isolated from each other in the second direction by the first to third trenches T1, T2 and T3. Herein, the second conductive layer 125 surrounding each of the first to fourth pillar portions may be stacked in multiple layers with the first inter-layer dielectric layer 120 between them.

The second semiconductor layer 165A of the first selection transistor is disposed over the first and fifth pillar portions of the first semiconductor layer 145, and the third semiconductor layer 165B of the second selection transistor is disposed over the fourth and sixth pillar portions.

A fourth semiconductor layer 165C may be disposed over the third connection portion of the first semiconductor layer 145.

Furthermore, the non-volatile memory device according to this exemplary embodiment may further include the first conductive layer 110 which surrounds the first connection portion and the second connection portion with the memory gate insulation layer 140 between them, and accordingly, the first pipe channel transistor may be disposed under the memory string. Also, the non-volatile memory device according to this exemplary embodiment may further include the third conductive layer 135 contacting the fifth and sixth pillar portions and the third connection portion with the memory gate insulation layer 140 between them. Accordingly, the second pipe channel transistor may be disposed over the memory string.

Also, the second and third semiconductor layers 165A and 165B may further include the first and second junction regions 180A and 180B formed in their upper portion. The first and second junction regions 180A and 180B may be a drain region and a source region, respectively.

The second line 195 and the third line 210 extend in a direction crossing each other and are disposed over the first and second junction regions 180A and 180B. Herein, since the extension directions of the second line 195 and the third line 210 cross each other, the second line 195 and the third line 210 should be disposed in different layers. Therefore, either the second line 195 or the third line 210 is disposed over the first junction region 180A and coupled to the contact 205. In other words, the contact 205 may be coupled either the second line 195 or the third line 210 depending on which line is over the other. Also, the first line 190 extended in a direction parallel to the second line 195 is disposed over the fourth semiconductor layer 165C.

According to an exemplary embodiment of the present invention, a non-volatile memory device may perform an F-N tunneling erase operation by providing the fourth semiconductor layer 165C, which is a layer that is directly coupled with the channel layer of the memory cell and functions as a substrate body. Therefore, the operation characteristics of the non-volatile memory device, such as erase operation speed may be improved.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device comprising:
   a memory string including a plurality of memory cells coupled in series,
   the memory string further including:
      a first semiconductor layer,
      a second conductive layer, and
      a memory gate insulation layer between the first semiconductor layer and the second conductive layer;
   a first selection transistor comprising a second semiconductor layer coupled with one end of the first semiconductor layer;
   a second selection transistor comprising a third semiconductor layer coupled with the other end of the first semiconductor layer;
   a fourth semiconductor layer contacting the first semiconductor layer in a region where the second conductive layer is not disposed;
   a first line connected to the fourth semiconductor layer;
   a second line connected to the second semiconductor layer; and
   a third line connected to the third semiconductor layer.

2. The non-volatile memory device of claim 1, wherein the first semiconductor layer comprises:
   first to fourth pillar portions extending perpendicularly to a substrate and aligned in one direction;
   a first connection portion coupling lower portions of the first and second pillar portions;
   a second connection portion coupling lower portions of the third and fourth pillar portions; and
   a third connection portion coupling upper portions of the second and third pillar portions, and
   wherein the second conductive layer surrounds side surfaces of the first to fourth pillar portions with the memory gate insulation layer therebetween, and
   the second semiconductor layer and the third semiconductor layer are disposed over the first pillar portion and fourth pillar portion respectively, and
   the fourth semiconductor layer is disposed over the third connection portion.

3. The non-volatile memory device of claim 1, wherein the second semiconductor layer and the third semiconductor layer comprise a first junction region and a second junction region formed in the upper portions of the second semiconductor layer and the third semiconductor layer, respectively, and
   the first semiconductor layer and the fourth semiconductor layer have a first conductivity type, and the first junction region and the second junction region have a second conductivity type, which is opposite to the first conductivity type.

4. The non-volatile memory device of claim 3, wherein the first conductivity type is a P type and the second conductivity type is an N type.

5. The non-volatile memory device of claim 4, wherein a concentration of a P-type impurity of the fourth semiconductor layer is higher than a concentration of a P-type impurity of the first semiconductor layer.

6. The non-volatile memory device of claim 1, further comprising:
   a contact interposing between the third semiconductor layer and the third line.
   wherein the first line is disposed over the fourth semiconductor layer,
   the second line is disposed over the second semiconductor layer and extends in a direction parallel to the first line, and
   the third line is disposed over the third semiconductor layer and extends in a direction crossing the second line.

7. The non-volatile memory device of claim 2, further comprising:
   a first conductive layer adjacent to the first and second connection portions; and
   a gate insulation layer interposed between the first conductive layer and the first and second connection portions.

8. The non-volatile memory device of claim 2, further comprising:
   a third conductive layer adjacent to the third connection portion; and
   a gate insulation layer interposed between the third conductive layer and the third connection portion.

9. The non-volatile memory device of claim 1, wherein the memory cells are configured to be erased during an erase operation in which an erase voltage is applied to the fourth semiconductor layer.

10. The non-volatile memory device of claim 9, wherein the erase voltage ranges from approximately 10 V to approximately 25 V.

11. A method for fabricating a non-volatile memory device comprising:
    forming a memory string including a plurality of memory cells coupled in series:
    forming the memory string further including:
       forming a first semiconductor layer,
       forming a second conductive layer, and
       forming a memory gate insulation layer between the first semiconductor layer and the second conductive layer;
    forming second and third semiconductor layers respectively coupled with one end and the other end of the first semiconductor layer; and
    forming a fourth semiconductor layer coupled with the first semiconductor layer in a region where the second conductive layer is not disposed:
    forming a first line connected to the fourth semiconductor layer;
    forming a second line connected to the second semiconductor layer; and
    forming a third line connected to the third semiconductor layer.

12. The method of claim 11, wherein the forming of the memory string comprises:
    forming the first semiconductor layer which comprises:
       first to fourth pillar portions extending perpendicularly to a substrate and aligned in one direction;

a first connection portion coupling lower portions of the first and second pillar portions;

a second connection portion coupling lower portions of the third and fourth pillar portions; and a third connection portion coupling upper portions of the second and third pillar portions, and forming the second conductive layer which surrounds side surfaces of the first to fourth pillar portions with the memory gate insulation layer therebetween.

13. The method of claim 12, further comprising:

forming a first conductive layer adjacent to the first and second connection portions with a gate insulation layer therebetween.

14. The method of claim 12, further comprising:

forming a third conductive layer adjacent to the third connection portion with a gate insulation layer therebetween.

15. The method of claim 12, wherein in the forming of the second to fourth semiconductor layers, the second semiconductor layer is disposed over the first pillar portion, and the third semiconductor layer is disposed over the fourth pillar portion, and the fourth semiconductor layer is disposed over the third connection portion.

16. The method of claim 11, further comprising:

forming a first junction region and a second junction region by selectively doping the second semiconductor layer and the third semiconductor layer with an impurity after the forming of the second to fourth semiconductor layers.

17. The method of claim 16, wherein in the forming of the first junction region and the second junction region, the second semiconductor layer and the third semiconductor layer are doped with an impurity of a conductivity type which is opposite to a conductivity type of the first and fourth semiconductor layers.

18. The method of claim 11, further comprising:

forming a contact interposing between the third semiconductor layer and the third line, wherein the first line is disposed over the fourth semiconductor layer, the second line is disposed over the second semiconductor layer and extends in a direction parallel to the first line, and the third line is disposed over the third semiconductor layer and extends in a direction crossing the second line.

19. A method for fabricating a non-volatile memory device, the method comprising:

forming a first conductive layer over a substrate;

selectively etching the first conductive layer to form two or more grooves;

forming a first sacrificial layer pattern to fill the two or more grooves;

forming a cell gate structure by stacking a first inter-layer dielectric layer, a second conductive layer, and another first inter-layer dielectric layer;

forming a first channel hole, a second channel hole, a third channel hole, and a fourth channel hole, wherein the first channel hole and the second channel hole expose the first sacrificial layer pattern in one of the grooves, and the third channel hole and fourth channel hole expose the first sacrificial layer pattern in an adjacent groove;

forming a first pipe channel hole connecting the lower ends of the first and second channel holes, forming another first pipe channel hole connecting the lower ends of the third and fourth channel holes, and forming a second pipe channel hole connecting the top ends of the second and third channel holes;

forming a gate insulation layer along internal walls of the first to fourth channel holes, the two first pipe channel holes, and the second pipe channel hole;

forming a first semiconductor layer inside the first to fourth channel holes, the two first pipe channel holes, and the second pipe channel hole; and forming a first line over the second pipe channel hole and electrically coupled to the first semiconductor layer inside the second pipe channel hole.

20. The method of claim 19, wherein the forming of the two first pipe channel holes and the second pipe channel hole comprises:

filling the first to fourth channel holes with a second sacrificial layer;

etching a first trench between the first and second channel holes, etching a second trench between the second and third channel holes, and etching a third trench between the third and fourth channel holes, wherein etching is performed until each of the first to third trenches exposes the lowermost first inter-layer dielectric layer;

filling the first to third trenches;

forming a third conductive layer over the filled first to third trenches;

selectively etching the third conductive layer to expose the second sacrificial layer filling each of the first to fourth channel holes and to form an opening over all structures between the second and third channel holes; and etching the second sacrificial layer and the first sacrificial layer pattern.

* * * * *